US006049240A

United States Patent [19]

Kato

[11] Patent Number: 6,049,240

[45] Date of Patent: Apr. 11, 2000

[54] LOGICAL DELAYING/ADVANCING CIRCUIT USED

[75] Inventor: Kazuo Kato, Chiba, Japan

[73] Assignee: Seiko Instruments Inc.

[21] Appl. No.: 09/049,619

[22] Filed: Mar. 27, 1998

[30] Foreign Application Priority Data

Mar. 28, 1997 [JP] Japan .................................... 9-078403
Jan. 22, 1998 [JP] Japan .................................... 10-010429

[51] Int. Cl.[7] .................................................... H03H 11/26

[52] U.S. Cl. .......................... 327/265; 327/160; 327/161; 327/232; 327/242; 327/245; 327/250; 327/262; 372/25

[58] Field of Search .................................... 327/160, 161, 327/232, 241, 242, 245, 250, 262, 265

[56] References Cited

U.S. PATENT DOCUMENTS 5,457,719 10/1995 Guo et al. .................................. 327/2
5,561,692 10/1996 Maitland et al. ....................... 327/153

*Primary Examiner*—Margaret R. Wambach
*Attorney, Agent, or Firm*—Adams & Wilks

[57] ABSTRACT

An oscillating means having an oscillator outputs a reference clock, and a frequency-dividing means sequentially frequency-dividing the reference clock into a half frequency. A temperature correction data creating means detects a temperature, calculates logical delaying/advancing data for a temperature change, and outputs the logical delaying/advancing data in every predetermined period. A temperature correction data input means receives the delaying/advancing data outputted by the temperature correction data creating means and outputs the logical delaying/advancing data to a logical delaying/advancing means. The logical delaying/advancing means operates a state of the frequency-dividing means in every predetermined period on the basis of the set logical delaying/advancing data to control the period of the frequency-divided output signal of the frequency-dividing means so as to be coincident with a desired period. Owing to this temperature correction data input means, it becomes possible to separate the temperature correction data creating means conventionally incorporated.

10 Claims, 10 Drawing Sheets

LOGICAL DELAYING/ADVANCING CIRCUIT USED

BACKGROUND OF THE INVENTION

This invention relates to a logical delaying/advancing circuit to perform fine adjustments of time accuracy, and to an electronic device such as an electronic clock that uses the logical delaying/advancing circuit to achieve high time accuracy.

Conventionally, a circuit as shown in FIG. 9 has been employed to carry out a method to perform logical delaying/advancing in units of one period of a frequency-division circuit, in order to compensate for a deviation in an oscillating of an oscillater 501 frequency resulting from a variation caused by manufacture. The logical delaying/advancing operation will be briefly explained on the basis of FIG. 9 and FIG. 10 showing a timing chart. A reference clock a outputted from a quartz oscillator circuit 501 is inputted to a frequency-dividing circuit constituted by T-type flip-flops (hereinafter called TFF) 502–509, and sequentially frequency-divided. Where no logical delaying/advancing operation is performed, accurate ½ frequency-division is made as in a section from time period A to time period B in FIG. 10. Terminals 511–514 of an IC are connected to D1–D4 as logical delaying/advancing data signals, and the data signals D1–D4 are pulled up by a resistance. OR gates 521–524 having inputs of VCWX as a logical delaying/advancing control signal and D1–D4 as logical delaying/advancing data signals have an output connected to a set input SX of TFFs 503–506.

The logical delaying/advancing operation is usually executed every period of 10 seconds, and at this time an "L" level of a pulse signal VCWX is generated in synchronism with a rise in the TFF 507Q output at timing B in FIG. 10. The signal VCWX has a pulse width of a half of a period of the reference clock. A predetermined TFF among the TFFs 502–506 is forcibly preset by this "L"-level pulse signal VCWX, thereby carrying out a predetermined amount of a logical delaying/advancing operation. For example, where the IC terminals 512–514 are open by virtus of pattern cutting during circuit board manufacture and the IC terminal 511 is connected to VSS in the circuit-board pattern, logical delaying/advancing data signals have D2–D4 becoming "H" and D1 becoming "L". In synchronism with the signal VCWX, output signals c, d, e and f of the OR gates 521–524 are outputted at respective levels of "L", "H", "H" and "H". Accordingly, an "L"-level pulse signal is applied to the set input SX of the TFF 503 in this case, and the Q output of the TFF 503 is forcibly brought into an "H" level (timing B). Since the frequency-divided clock of the TFF 502 is successively inputted to the TFF 503, TFF 503 has a rising Q output signal at timing c of FIG. 10, and thereafter the usual ½ frequency division is performed.

This series of operations act to omit one "L"-level section in the Q output of the TFF 503, that is, one period of time of the frequency-division clock of the TFF 502. If observed with respect to timing of a rise of the Q output of TFF 506, the one that would inherently rise at timing E in FIG. 10 has resulted in rising at timing D in FIG. 10. Therefore, delaying/advancing is made, as a result, in an advancing direction by one period of the Q output of the TFF 502.

It has been known perform logical delaying/advancing in a delaying or advancing direction by appropriately controlling the state of a frequency-dividing circuit at predetermined timing as described above.

In the conventional logical delaying/advancing method, the amount of delaying/advancing is determined by performing a pattern cutting of a circuit board or before at factory-shipping time of signal lines prepared as logical delaying/advancing data input means.

Therefore, where adjusting a delaying/advancing amount for a secondary temperature characteristic for a quartz rate, there is a necessity of preparing an delaying/advancing-amount adjusting means to compensate for temperature change within an IC. However, there is a difference in semiconductor processes between that of a temperature-change detecting IC and that of a logic IC, so that adjustment has to be made on the semiconductor process, raising a from the aspect problem of high cost and long development time.

SUMMARY OF THE INVENTION

It is an object of the present invention to provide a logical delaying/advancing circuit in which total cost can be reduced by adopting a process optimal for both an IC used for detecting changes in the environment, such as temperature by a process different from that of a logic IC, and a process optimal for a logic IC, in which temperature correction data generating means which is separated by the temperature correction data input means.

It is another object of the present invention to provide a logical delaying/advancing circuit where a similar effect as mentioned above is obtained in which the temperature correction data generating means is replaced by a positional difference correction data generating means, or where the positional difference correction data generating means is provided in addition to the temperature correction data generating means.

It is a further object of the present invention to provide a logical delaying/advancing circuit where the temperature correction data input means is not used, an operation is available as an ordinary logical delaying/advancing function.

DETAILED DESCRIPTION OF THE PREFERRED EMBODIMENTS

Figure 1:
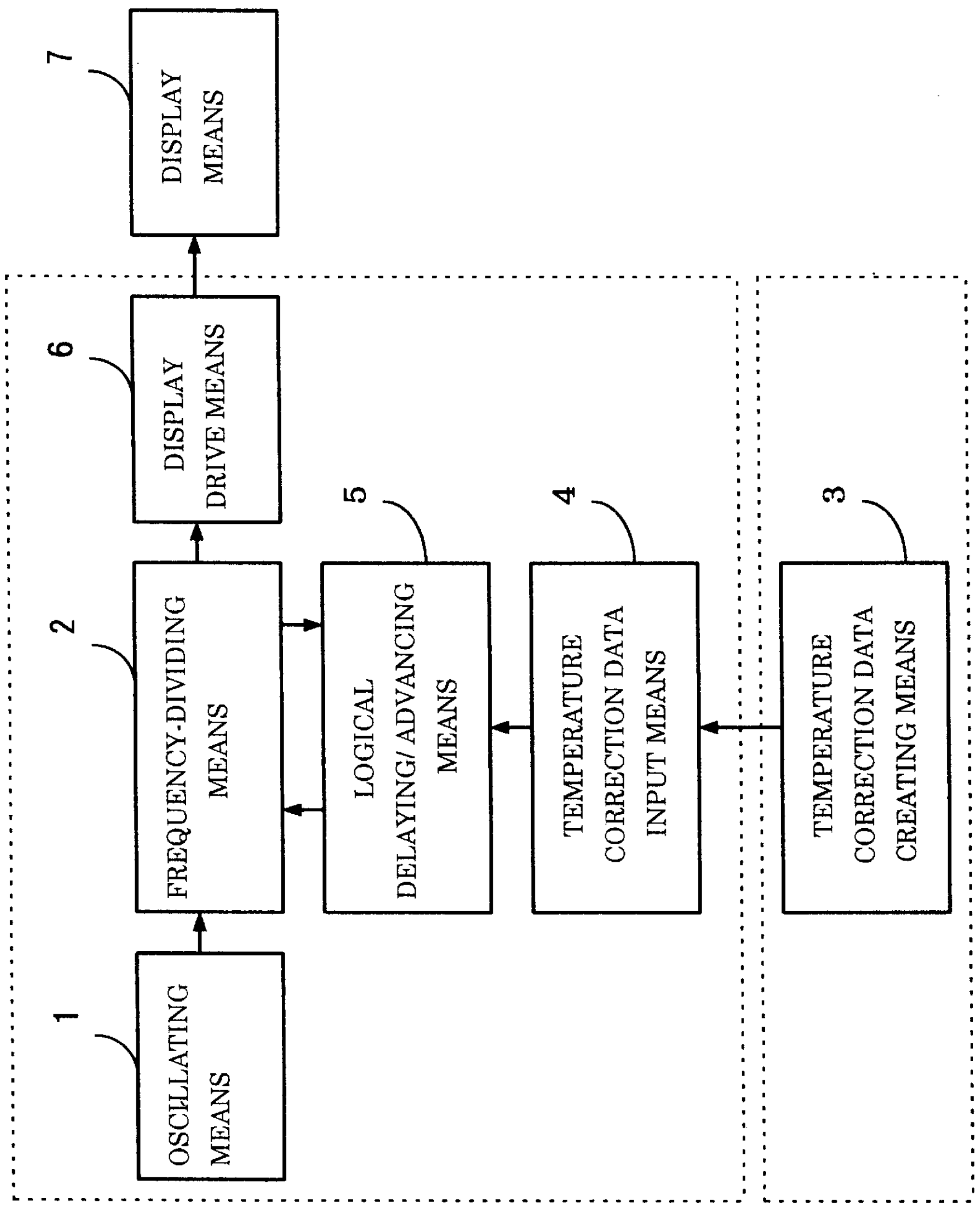
FIG. 1 is a functional block diagram showing one embodiment of a basic constitution of the present invention.

An oscillating means 1 having an oscillator such as quartz as an oscillating source outputs a reference clock, and a frequency-dividing means 2 sequentially divides the frequency of the reference clock into a half frequency. A temperature correction data generating means 3 detects a temperature, calculates logical delaying/advancing data for a temperature change, and outputs the logical delaying/advancing data once every predetermined period. A temperature correction data input means 4 receives the delaying/advancing data outputted by the temperature correction data generating means 3 and outputs the logical delaying/advancing data to a logical delaying/advancing means 5. The logical delaying/advancing means 5 controls the state of the frequency-dividing means 2 once every predetermined period on the basis of the set logical delaying/advancing data to control the period of the frequency-divided output signal of the frequency-dividing means 2 so as to be coincident with a desired period. By use of the temperature correction data input means 4, it becomes possible to separate the temperature correction data generating means 3 conventionally incorporated.

An embodiment of the present invention will be explained hereinbelow on the basis of the drawings.

An embodiment of the present invention will be explained on the basis of FIG. 1. An oscillating means 1 having an oscillator such as quartz as an oscillation source outputs a reference clock, and a frequency dividing means 2 sequentially divides the reference frequency by one half. A temperature correcting data generating means 3 detects a temperature and calculates delaying/advancing data in response to a temperature change, to output the delaying/advancing data once every predetermined period. A temperature correction data input means 4 receives the data outputted by the temperature correction data generating means 3 to output logical delaying/advancing data to a logical delaying/advancing means 5. By use of the temperature correction data input means 4, it becomes possible to separate the temperature correction data generating means 3 conventionally incorporated. The logical delaying/advancing means 5 controls the state of the frequency-dividing means 2 in every predetermined period on the basis of a set logical delaying/advancing data to control a period of a frequency output signal of the frequency dividing means 2 so as to coincide with a desired period. Also, it creates, by a display drive means 6, a display drive output signal for driving a display means 7 including an indicating hand or an optical display unit such as a liquid crystal display or a light emitting diode on the basis of a time reference signal for which the frequency-divided output signal of the frequency-dividing means is used. By this construction, an electronic device, such as an electronic watch, is available in which time information such as current time or elapsed time can be accurately adjusted by a means of logical circuit.

Figure 2:
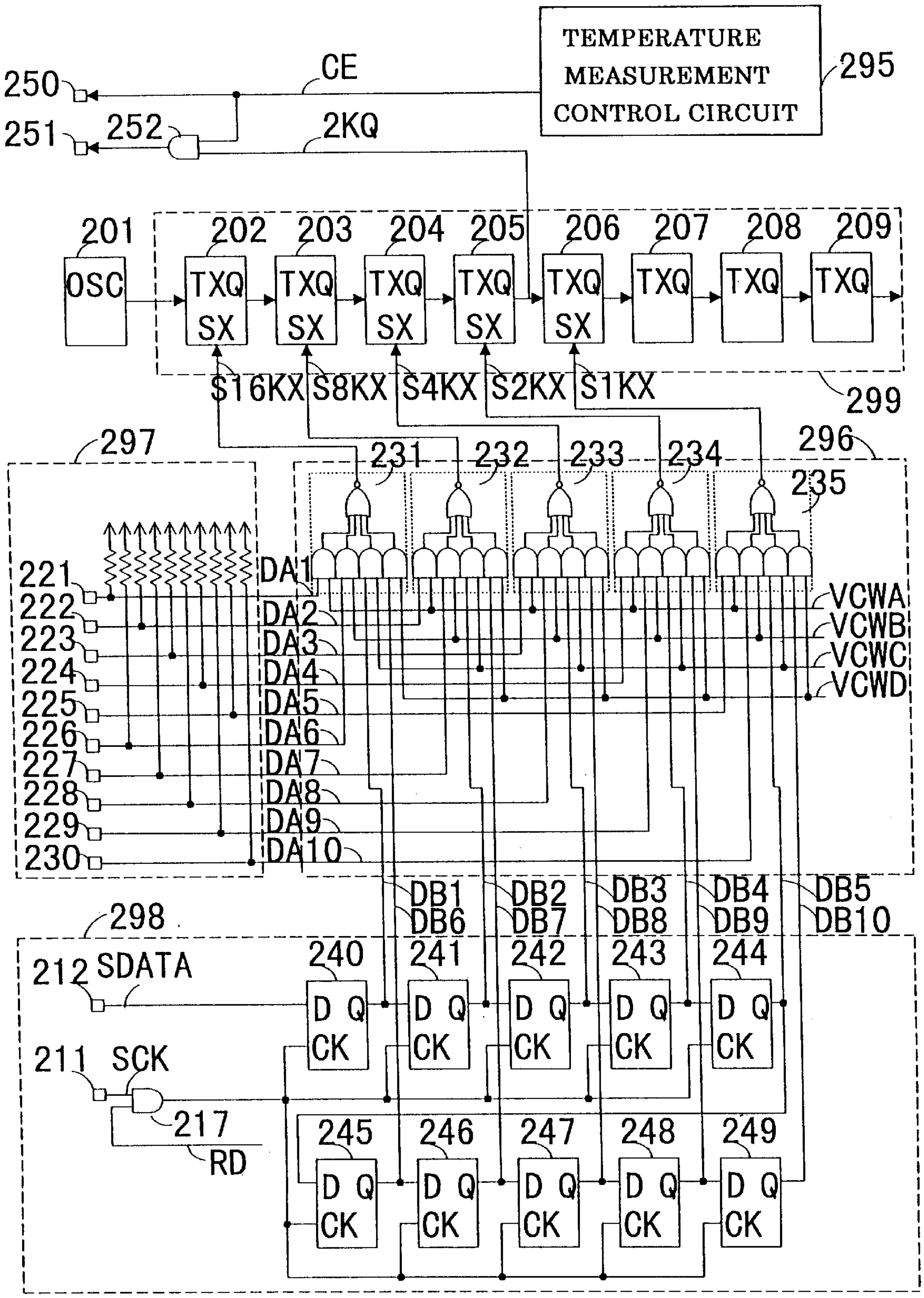
FIG. 2 is a circuit diagram showing an embodiment of a temperature correction data receiving circuit of the present invention.

A quartz oscillating circuit 201 in FIG. 2 outputs a reference clock signal. In this embodiment, the reference clock has a frequency determined at 32 kHz. A frequency-dividing circuit 299 includes eight stages of TFFs 202–209. Although several stages of TFFs are actually connected behind the TFF 209 in order to synthesize a control signal for actuating a display drive circuit and the like, they will be omitted here. A temperature measurement controlling circuit 295 receives frequency-divided outputs of the frequency dividing circuit 299 and a rear stage of the TFF 209 as input signals to output a control signal CE for a temperature correcting data generating IC to a terminal 250. An AND gate 252 receives an output signal TXQ of the TFF 205 and an output signal CE of the temperature measurements controlling circuit 295 as input signals so that it outputs a reference clock CLK of the temperature correcting data generating circuit IC to a terminal 251.

A delaying/advancing data receiving circuit 298 has input signals including a synchronizing signal SCK and a delaying/advancing data signal SDATA outputted from the temperature correction data generating IC connected to terminals 211 and 212, and a control signal RD for which output signals of the frequency dividing circuit 299 are synthesized, so that, when RD is "H", it receives SDATA in synchronism with SCK and outputs logical delaying/advancing data receiving signals DB1–DB10. A logical delaying/advancing terminal circuit 297 has inputs of IC terminals 221–230, each of which is pulled up by a resistance within the IC to output logical delaying/advancing data signals DA1–DA10. The logical delaying/advancing terminal circuit 297 outputs, as the logical delaying/advancing signals DA1–DA10, an "L" level when connecting the IC terminal 221–230 to VSS, and an "H" level by a pull-up resistance when in an open state. A frequency dividing controlling circuit 296 has input signals of DB1–DB10 outputted from the delaying/advancing data receiving circuit 298 and control signals VCWA, VCWB, VCWC and VCWD as well as synthesized signals of DA1–DA10 outputted from the logical delaying/advancing terminal circuit 297 and an output signal of the frequency dividing circuit 299. It outputs logical delaying/advancing operation signals S16KX, S8KX, S4KX, S2KX, S1KX for presetting the TFFs 202–206 in the frequency dividing circuit 299 in synchronism with the VCWA, VCWB, VCWC when any one signal or more of the DA1–DA10, DB1–DB10 are at "H" levels.

Figure 3:
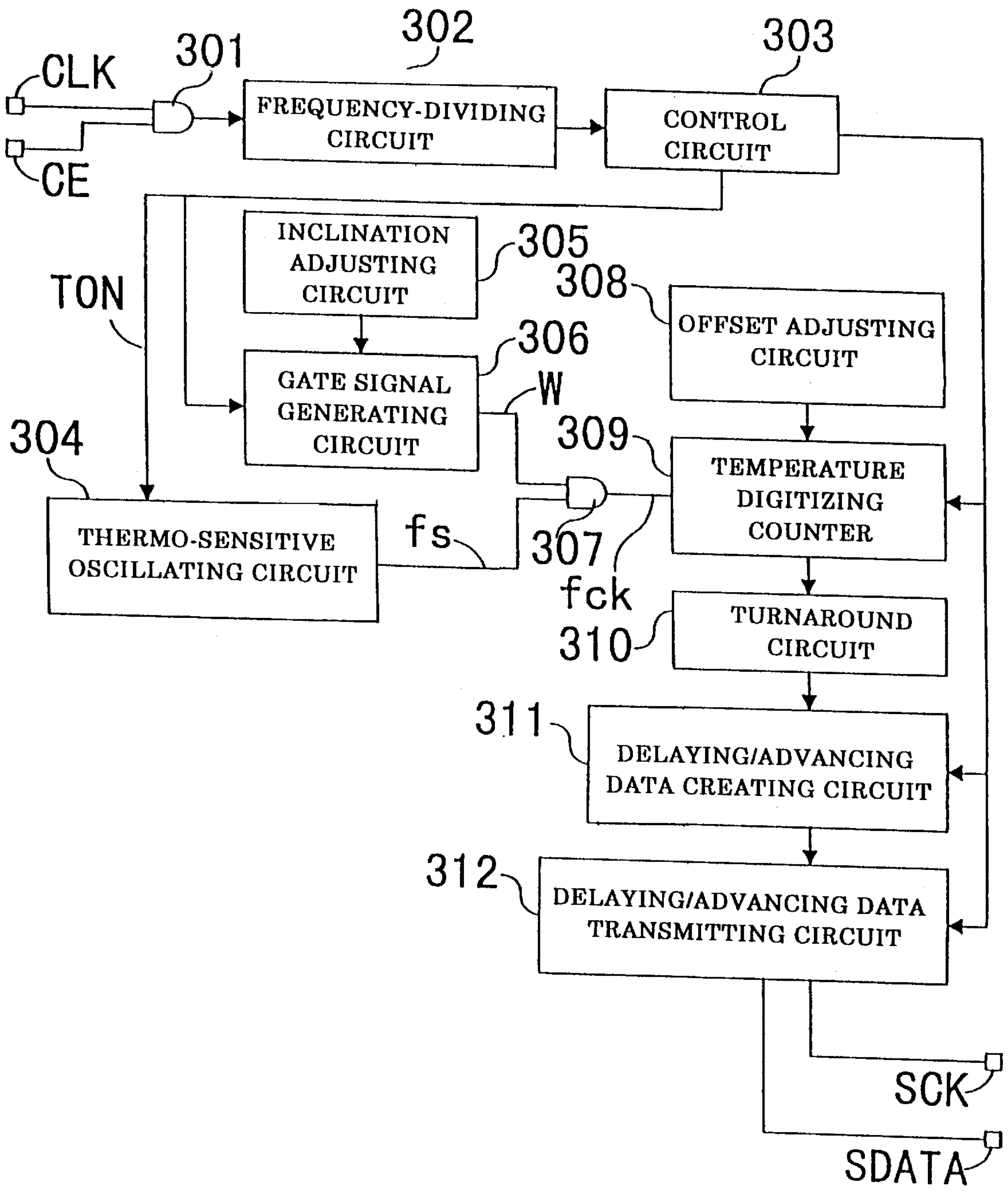
FIG. 3 is a block diagram showing an embodiment of a temperature correction data generating circuit of the present invention.
Figure 4:
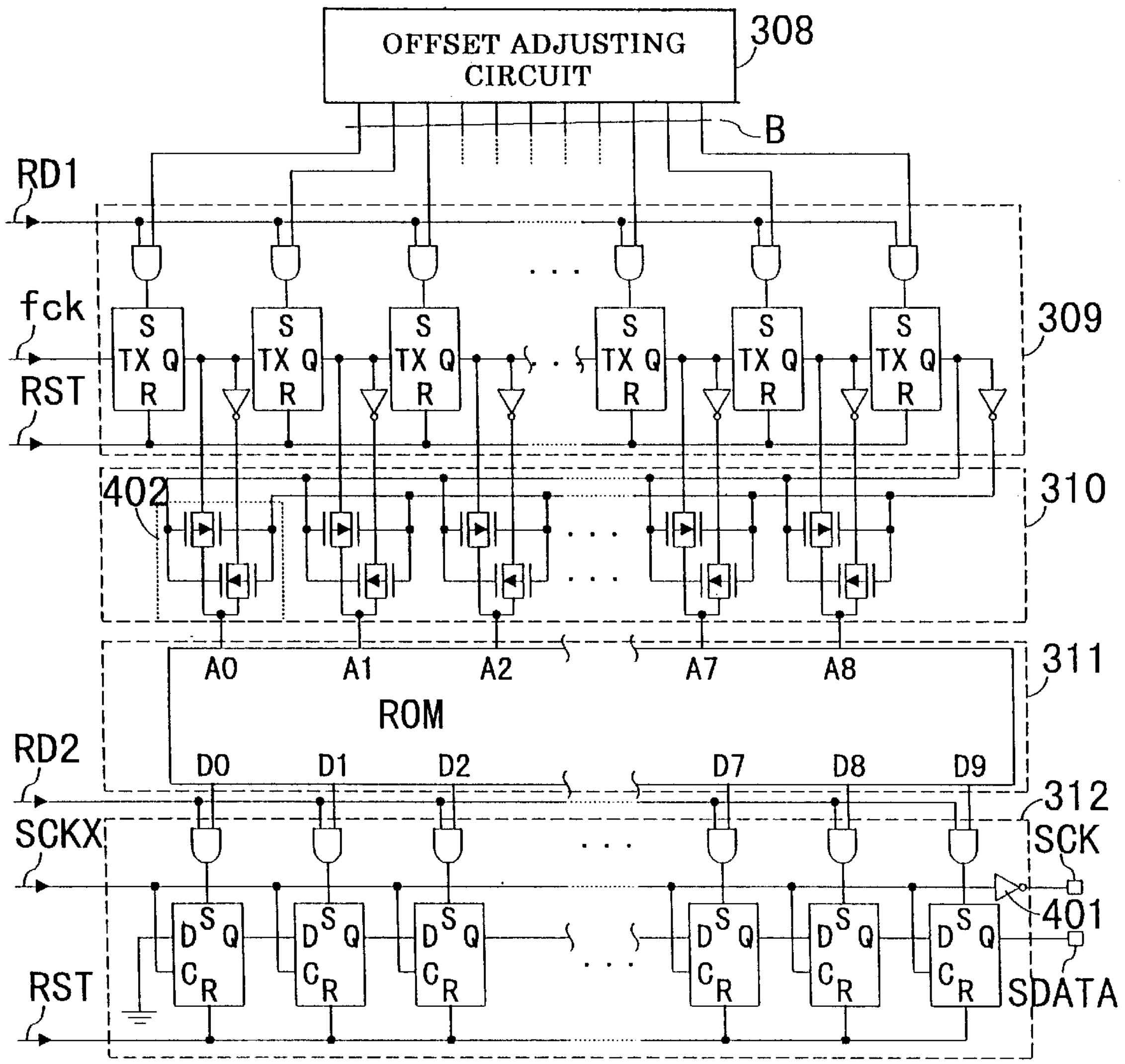
FIG. 4 is a circuit diagram showing an embodiment of the temperature correction data creating circuit of the present invention.
Figure 5:
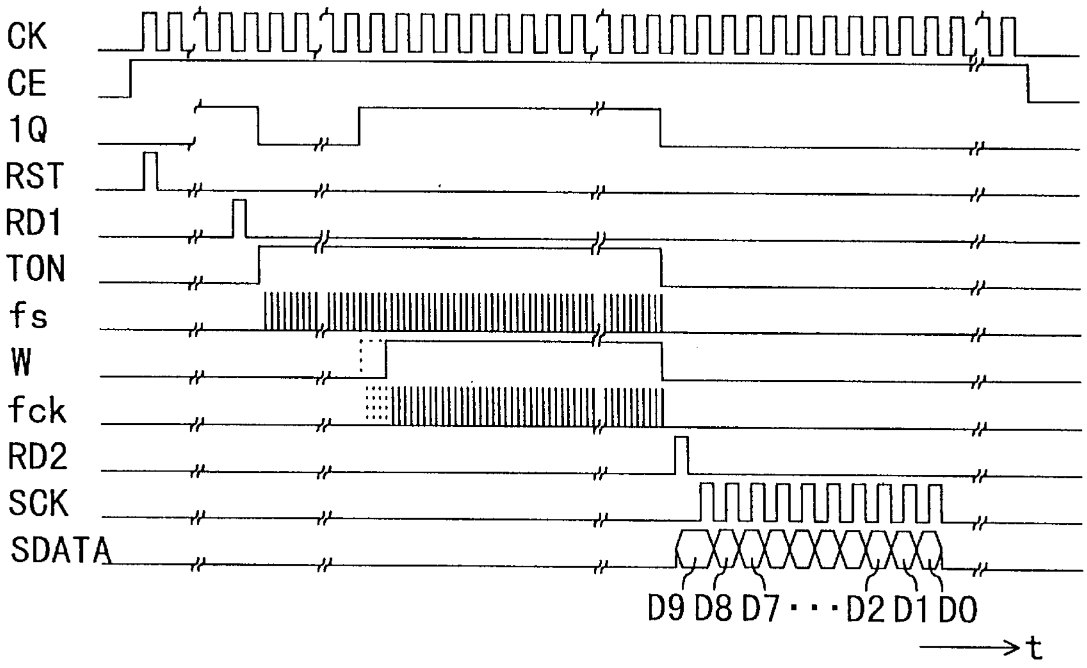
FIG. 5 is a timing chart showing an operation of the temperature correction data creating circuit of the present invention.

FIG. 3 is a block diagram of the temperature correction data generating means 3, FIG. 4 is a diagram specifically showing the contents of 308, 309, 310, 311 and 312, and FIG. 5 is a timing chart for explaining operation thereof.

An AND 301 has input signals of the control signal CE of the temperature correction data creating IC and the reference clock CLK outputted by the temperature measurement control circuit 295 in FIG. 2, so that it outputs a clock CLK to a frequency-dividing circuit 302 when CE is at "H".

A thermo-sensitive oscillating circuit 304 is a temperature detecting circuit that outputs an output signal frequency fs linearly varying with respect to temperature.

The output of the thermo-sensitive oscillating circuit 304 is connected to on AND gate circuit 307. The AND gate circuit 307 has another input to which a gate signal generating circuit 306 is connected.

A gate signal W output by the gate signal generating circuit 306 has a pulse width that is varied by an inclination adjustment value A of the inclination adjusting circuit 305. The output signal of the thermo-sensitive circuit 304 is input to a temperature digitizing counter 309 when output of the gate signal generating circuit 306 is "H" via the output of the AND gate 307.

The temperature digitizing counter circuit 309 has an initial value set by an offset adjustment value B of the offset adjusting circuit 308.

As a result, numeric information m in the temperature digitizing counter 309 can be expressed by the following equation:

$$m = A \times \tau \times fs + B - 2^{L} \times j$$

wherein:

T is a unit time of the gate signal output by the gate signal generating circuit 306, L represents the number of bits of the temperature digitizing counter 309, fs represents an output frequency of the thermo-sensitive oscillating circuit 304, j denotes the umber of times of overflows, m varies between 0 and 1023, provided that the number of bits L of the temperature digitizing counter 309 is taken as 10 bits.

An operation is made by A and B to set a median value 512 of m with a zero-temperature coefficient temperature (hereinafter abbreviated as Tp) of a quartz oscillator of the oscillating circuit 201.

In order to make m symmetrically vary at high and low temperatures with Tp centered, the output m of the temperature digitizing counter 309 is inverted by seeing the most significant bit in a turnaround circuit 310 to create temperature data n.

This temperature data n is information representing to what extent the temperature is deviated from Tp of the oscillating circuit 201 in FIG. 2 taken as center. Accordingly, a temperature compensation data R can be calculated by squaring this n to be multiplied by a certain coefficient K.

Figure 6:
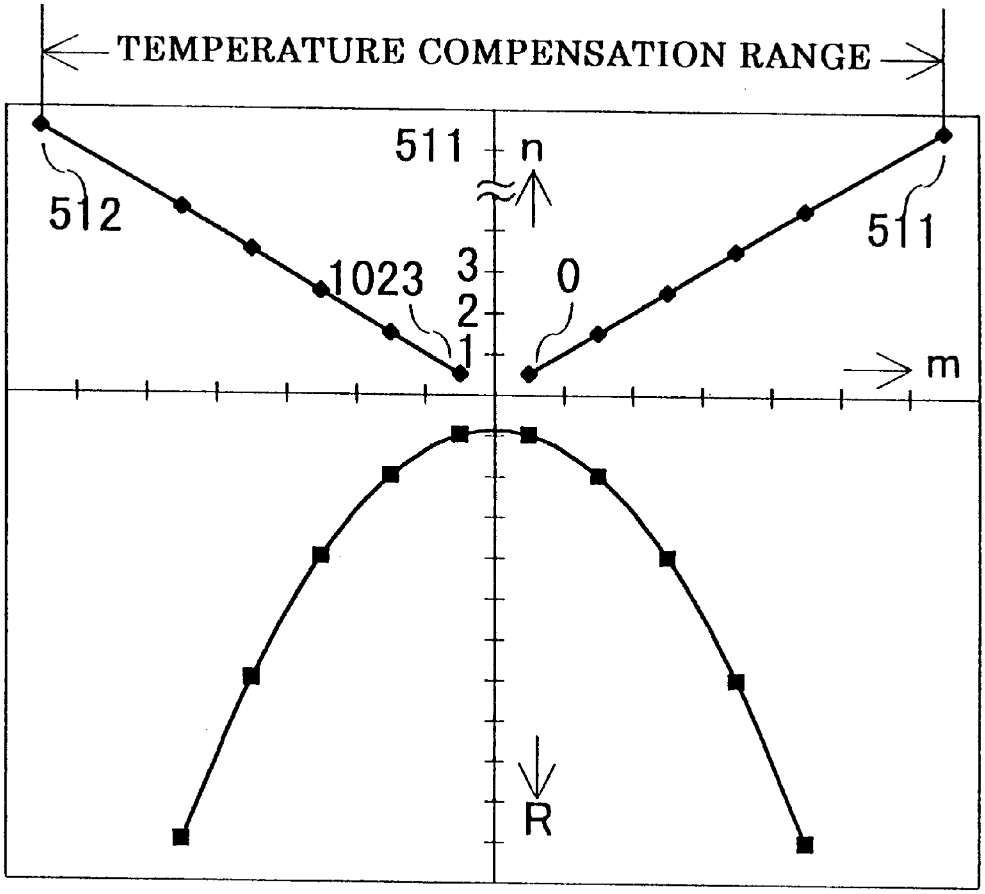
FIG. 6 is a diagram showing temperature correction data R for which the temperature data n+0.5 is squared and digitized.

When calculating R, the value added by 0.5 to the data n is squared to be put into an integer. This is shown in FIG. 6.

A delaying/advancing data generating circuit 311 is configured by a ROM with 9-bit address and a 10-bit data so that it stores the calculated temperature compensation data R as data and is supplied with 9-bit temperature data n by the turnaround circuit 310 to output 10-bit temperature compensation data R.

A coefficient K is a value determined by a delaying/advancing resolution, a secondary temperature coefficient of the quartz oscillator, and a temperature coefficient of the thermo-sensitive oscillating circuit, and is 1/256 in this embodiment.

Since the delaying/advancing data generating circuit 311 is a circuit for outputting the temperature compensation data R for the secondary temperature characteristic of the quartz oscillator from the temperature data n, it may be configured by using a square calculating circuit so as to calculate and output the temperature compensation data R from the temperature data n.

A delaying/advancing data transmitting circuit 312 inputs the temperature compensation data R output by the delaying/advancing data generating circuit 311 to output delaying/advancing data in serial as the delaying/advancing signal SDATA according to the synchronizing signal SCK of the control circuit 303.

In FIG. 4, the offset adjusting circuit 308 outputs an offset adjusting value B. The offset adjusting value B consists of 10 bits having an value from 0 to 1023.

The temperature digitizing counter circuit 309 comprises a counter comprising 10 TFFs and 10 AND gates for setting the offset adjusting value B in the counter. Each AND gate thereof has input signals consisting of an output of the offset adjusting circuit 308 and an output signal RD1 of the control circuit 303, so that it outputs the output of the offset adjusting circuit 308 to the set input terminal of each TFF when RD1 has an "H" section. The offset adjusting value B is thus set in the counter. The temperature digitizing counter circuit 309 also has an input consisting of the output fck of AND gate 307 in FIG. 3, to output the output of each TFF and its inverted output to the turnaround circuit 310.

The turnaround circuit 310 comprises 9 signal selecting circuits 402, and each signal selecting circuit is formed by 2 transmission gates. The turnaround circuit 310 has inputs of a low order 9-bit TFF output of the temperature digitizing counter 309 and the inverted output so that it selects the output or the inverted output of the temperate digitizing counter 309 based on the most significant bit output of the temperature digitizing counter 309 to output it as temperature data n to the delaying/advancing data generating circuit 311.

The delaying/advancing data generating circuit 311 is configured by a 9-bit address and a 10-bit data ROM to memorize as data the calculated temperature compensation data R, and inputs the 9-bit temperature data n outputted by the turnaround circuit 310 as the ROM address to output 10-bit temperature compensation data R.

A delaying/advancing data transmitting circuit 312 is constituted by a shift register comprising 10 DFFs and 10 AND gates for setting transmission data to the shift register. The 10-bit output of the delaying/advancing generating circuit 311 is connected to each AND gate, while the output signal RD2 of the control circuit 303 is connected to the other input. The output of each AND gate outputs delaying/advancing data of the delaying/advancing data generating circuit 311 when the signal RD2 is in the "H", and is set in the shift register. The shift register of the delaying/advancing data transmitting circuit 312 has an input of the output signal SCKX of the control circuit 303, and sequentially outputs delaying/advancing data to the serial output signal SDATA of the delaying/advancing data in synchronism with the rise of the clock. The signal SCKX is inverted by an inverter 401, and outputs the synchronism signal SCK of the serial output signal SDATA of the delaying/advancing data.

Now, the operation of the temperature correction data creating means 3 will be explained according to a timing chart shown in FIG. 5.

When it becomes a time for measuring a temperature, the output signal CE of the temperature measurement control circuit 295 becomes "H" and at the same time a 2-kHz clock signal CLK is input. Immediately after the signal CE becomes "H", the control circuit 303 outputs a signal RST to initialize the temperature digitizing counter 309 and delaying/advancing data transmitting circuit 312. Immediately before falling of a 1-Hz output signal 1Q of the frequency-dividing circuit 302, the control circuit 303 in FIG. 3 outputs a signal RD1 to set an inclination adjusting value A and an offset adjusting value B. Next, at the falling edge of in the signal 1Q, the control circuit 303 in FIG. 3 outputs an operating signal TON for the temperature-sensitive oscillating circuit 304, and the temperature-sensitive oscillating circuit 304 outputs an output signal frequency fs that varies linearly with respect to temperature. At a next rise in the signal 1Q, the gate signal generating circuit 306 in FIG. 3 outputs a gate signal W according to the inclination adjusting value A. In the section where the gate signal W is of an "H" value, the output signal frequency fs of the temperaturesensitive oscillating circuit 304 is input to the temperature digitizing counter 309. At the falling edge of the signal IQ, the gate signal W falls, so that the clock input to the temperature digitizing counter 309 is stopped and at the same time the operating signal TON of the temperature-sensitive oscillating circuit 304 also falls. After the falling in the gate signal W, the control circuit 303 outputs a signal RD2, so that the delaying/advancing data transmitting circuit 312 is set with delaying/advancing data outputted from the delaying/advancing data generating circuit 311. Then, the control circuit 303 outputs a clock to a signal SCKX to cause the a shift register of the delaying/advancing transmitting circuit 312 to operate to serially output delaying/advancing data SDATA and output a synchronizing signal to SCK.

Figure 7:
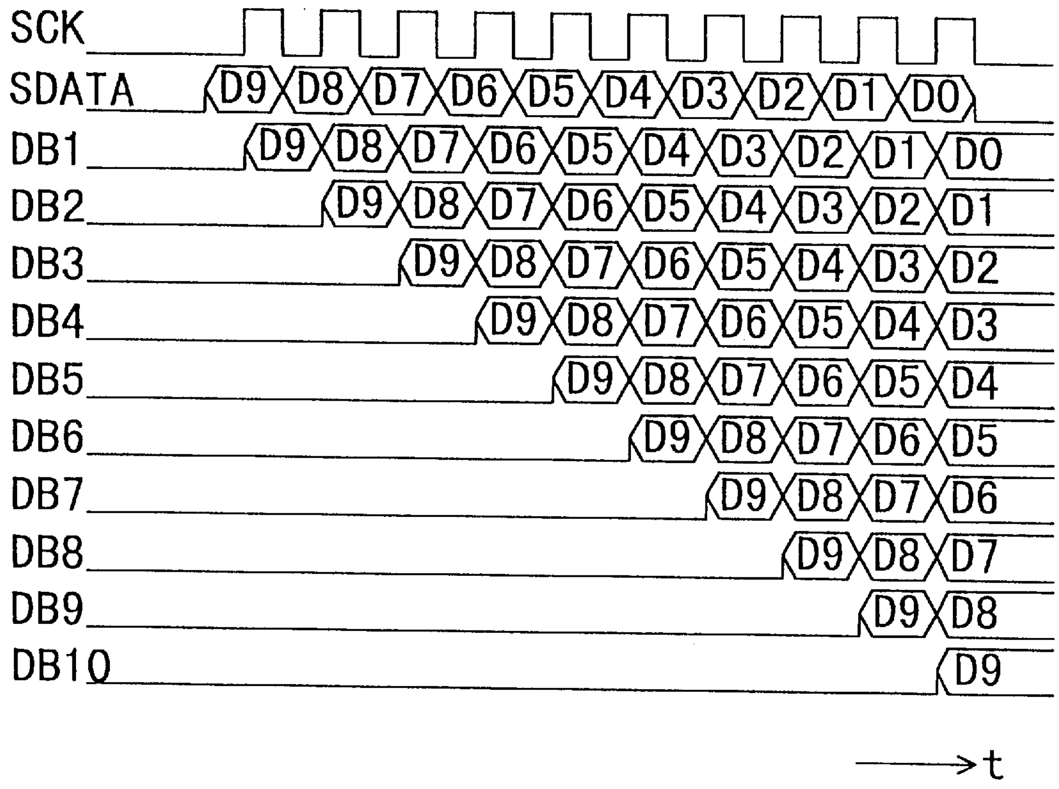
FIG. 7 is a timing chart showing a receiving operation of the temperature correction data receiving circuit of the present invention.

FIG. 7 is a timing chart of a logical delaying/advancing data receiving operation of the embodiment.

From the temperature correction data creating IC, a delaying/advancing data signal SDATA and a synchronizing signal SCK are outputted. The logical delaying/advancing data receiving circuit 298 is constituted by D-type flip-flops (hereinafter called as DFF) 240–249 and an AND gate 217. When a signal RD is in the "H" level, the data of SDATA is sequentially held in the DFF 240'249 to output and hold as logical delaying/advancing data signals DB1–DB10.

Figure 8:
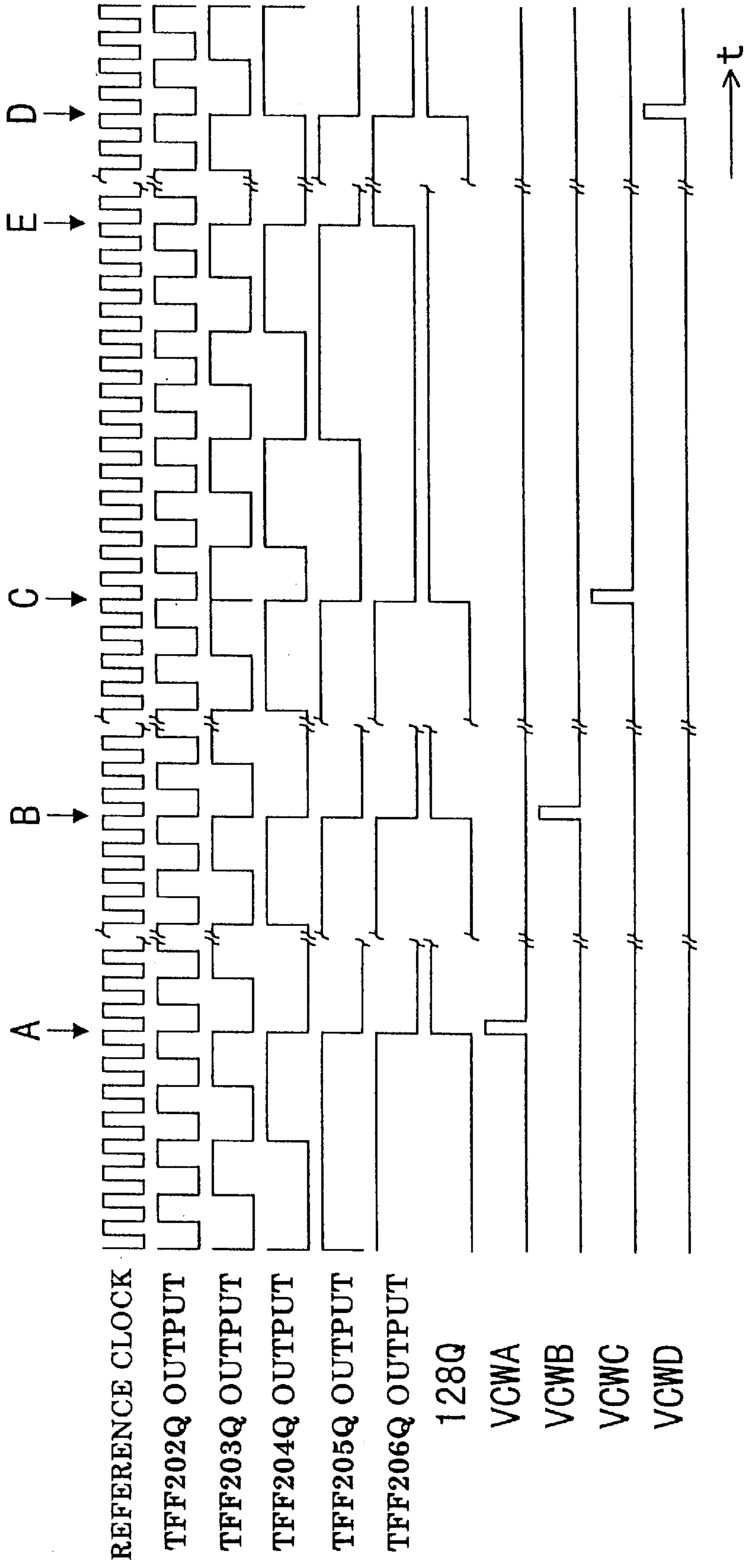
FIG. 8 is a timing chart showing a logical delaying/advancing operation by the temperature correction data receiving circuit of the present invention.
Figure 9:
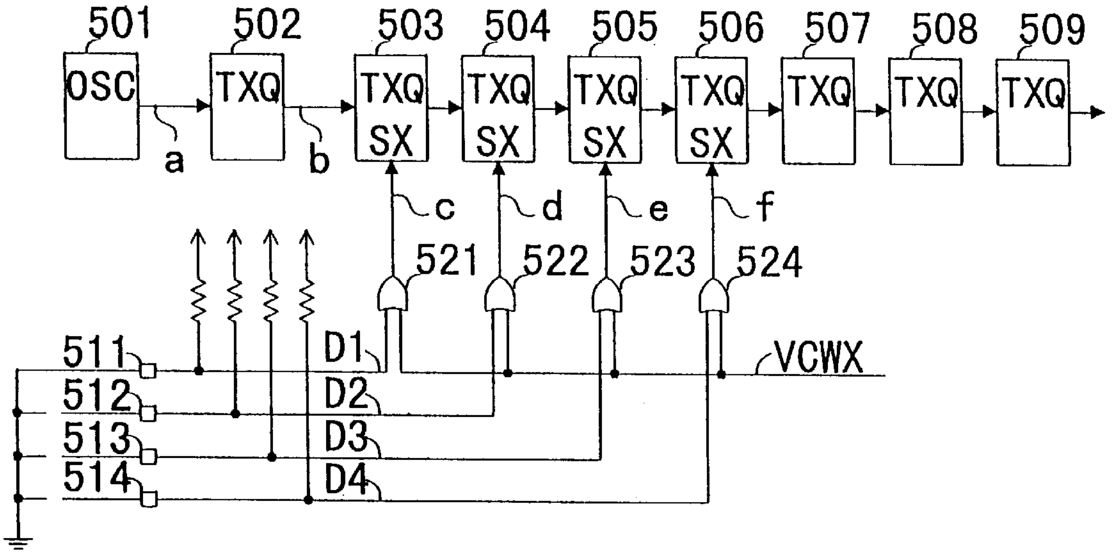
FIG. 9 PRIOR ART
FIG. 9 is a circuit diagram showing a conventional logical delaying/advancing circuit.
Figure 10:
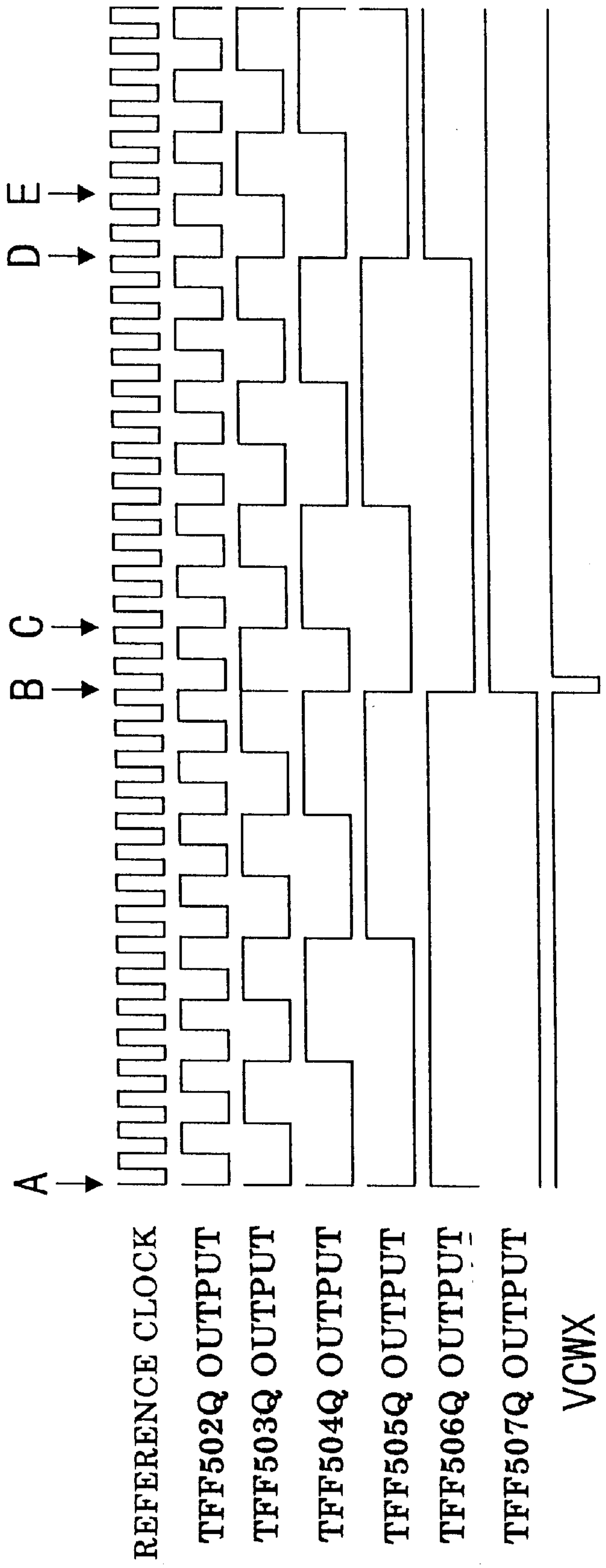
FIG. 10 PRIOR ART
FIG. 10 is a timing chart showing a logical delaying/advancing operation by the circuit diagram of the conventional logical delaying/advancing circuit.

FIG. 8 is a timing chart of a logical delaying/advancing operation. A control signal VCWA is inputted with an "H"-level pulse at a time A in synchronism with a rise of 128 Hz outputted in a period of 320 seconds by the frequency-dividing circuit 299. A control signal VCWB is inputted with an "H"-level pulse at a time B in synchronism with a rise of 128 Hz outputted in a period of 10 seconds by the frequency-dividing circuit 299. A control signal VCWC is inputted with an "H"-level pulse at a time C in synchronism with a rise of 128 Hz outputted in a period of 320 seconds by the frequency dividing circuit 299. A control signal VCWD is inputted with an "H"-level pulse at a time D in synchronism with the rise of 128 Hz outputted in a period of 10 seconds by the frequency dividing circuit 299. However, the control signals VCWA, VCWB, VCWC and VCWD are outputted so that the respective signal output timings do not coincide with the same timing. A frequency-dividing control circuit 296 is constituted by AND-NOR gates 231–235 so that it outputs data of signals DA1–DA5 in synchronism with the control signal VCWA, data of signals DA6–DA10 in synchronism with the control signal VCWB, data of signals DB1–DB5 in synchronism with the control signal VCWC, and data of signals DB6–DB10 in synchronism with the control signal VCWD as logical delaying/advancing operating signals S16K, S8K, S4K, S2K and S1K, respectively.

For example, where an SDATA data string is "L" "L" "L" "L" "L" "L" "L" "L" "HH" "L" in a time-sequence order, the delaying/advancing data receiving circuit 298 helds to output "L" "H" "L" "L" "L" "L" "L" "L" "L" "L" for the signals DB1–DB10, thereby performing a logical delaying/advancing operation in conformity to the timing chart shown in FIG. 8. That is, the TFF 203Q output is set by the "H"-level pulse signal VCWC outputted in synchronism with the rise (timing C) of 128 Hz outputted by the frequency-dividing circuit 299. Thereafter, a usual frequency-dividing operation is continued, and a TFF 205Q output falls at a timing E.

What is claimed is:

1. A logical delaying/advancing circuit for regulating an output of a frequency dividing means comprising:

oscillating means for outputting a reference clock signal;

frequency-dividing means for receiving and sequentially frequency-dividing the reference clock signal to produce a plurality of frequency-divided output signals each having a frequency equal to a fraction of the frequency of the reference clock signal;

temperature correction data generating means for detecting a temperature, calculating first logical delaying/advancing data to compensate for a variation in frequency of the reference clock signal due to temperature change, and outputting the first logical delaying/advancing data once every predetermined period;

temperature correction data input means for inputting the first logical delaying/advancing data output by the temperature correction data generating means;

logical delaying/advancing data input means for inputting second logical delaying/advancing data to compensate for a variation in frequency of the reference clock signal due to factors other than temperature; and logical delaying/advancing means for controlling the frequency-dividing means once every predetermined period on the basis of the first logical delaying/advancing data set by the temperature correction data input means and the second logical delaying/advancing data.

2. A logical delaying/advancing circuit according to claim 1; wherein the temperature correction data generating means is formed in a first integrated circuit and the oscillating means, the frequency-dividing means, the temperature correction data input means, the logical delaying/advancing data input means and the logical delaying/advancing means are formed in a second integrated circuit separate from the first integrated circuit.

3. A logical delaying/advancing circuit according to claim 1; wherein the oscillating means comprises an oscillating circuit having a quartz crystal oscillator for producing the reference clock signal.

4. A logical delaying/advancing circuit according to claim 3; wherein the reference clock signal has a first frequency value which deviates from a desired frequency value, and the second logical delaying/advancing data comprises data set to correct for the deviation of the first frequency value from the desired frequency value.

5. A logical delaying/advancing circuit according to claim 1; wherein the logical delaying/advancing means includes means for controlling the frequency-dividing means such that a selected cycle of a frequency-divided output signal of the frequency-dividing means coincides with a predetermined cycle to thereby compensate for the deviation between the first frequency value and the desired frequency value.

6. A logical delaying/advancing circuit according to claim 1; wherein the frequency-dividing means comprises a plurality of flip-flop circuits serially connected so as to sequentially divide by one-half the frequency of the reference clock signal.

7. A logical delaying/advancing circuit according to claim 1; wherein the logical delaying/advancing means includes means for adjusting the frequency-dividing means at predetermined time periods in response to a periodic control signal generated by the frequency-dividing means.

8. A logical delaying/advancing circuit according to claim 7; wherein the frequency dividing means comprises a plurality of flip-flop circuits serially connected so as to sequentially divide by one-half the frequency of the reference clock signal; and the logical delaying/advancing means comprises a logical circuit for setting a selected one of the flip-flops to a desired logic level at predetermined time intervals in accordance with the first logical delaying/advancing data set by the temperature correction data generating means and the second logical delaying/advancing data.

9. In an electronic timepiece having a display driving means for outputting a display drive output signal and display means for receiving the display drive output signal to display time information, the logical delaying/advancing circuit according to claim 1; wherein the display driving means outputs the display drive output signal based on the output signal output by the frequency dividing means.

10. A circuit for compensating for a deviation in oscillation frequency of a clock signal, comprising: an oscillation circuit for producing a clock signal; a frequency divider having a plurality of flip-flops serially arranged to sequentially divide the frequency of the clock signal; a temperature compensation circuit for producing first logical delaying/advancing data in accordance with a temperature variation; a logical delaying/advancing date setting circuit for setting second logical delaying/advancing data in accordance with a variation in frequency of the clock signal from a desired frequency; an input circuit for inputting the first and second logical delaying/advancing data; and a logical delaying/advancing circuit connected to selected ones of the flip-flops for controlling the frequency dividing operation of the frequency divider by setting one or more selected ones of the flip-flops to a desired logic level at predetermined time intervals in accordance with the first and second logical delaying/advancing data, such that a selected cycle of a respective divided output signal of a selected flip-flop coincides with a predetermined cycle; wherein the temperature compensation circuit is formed in a first integrated circuit, and the oscillation circuit, the frequency divider, the logical delaying/advancing data setting circuit and the logical delaying/advancing circuit are formed in a second integrated circuit separate from the first integrated circuit.

* * * * *